United States Patent [19]

Tang

[11] Patent Number: 5,736,874
[45] Date of Patent: Apr. 7, 1998

[54] HIGH RESOLUTION HIGH SPEED COMPARATOR

[75] Inventor: Zhilong Tang, Allentown, Pa.

[73] Assignee: Lucent Technologies Inc., Murray Hill, N.J.

[21] Appl. No.: 716,824

[22] Filed: Sep. 20, 1996

[51] Int. Cl.[6] .................................................. H03K 5/22
[52] U.S. Cl. .................................................. 327/65; 327/563
[58] Field of Search .................................. 327/65, 66, 67, 327/108, 307, 561, 562, 563, 427

[56] References Cited

U.S. PATENT DOCUMENTS

| | | | |
|---|---|---|---|
| 5,289,058 | 2/1994 | Okamoto | 327/65 |
| 5,293,514 | 3/1994 | Nakagawara | 327/65 |
| 5,298,801 | 3/1994 | Vorenkamp et al. | 327/65 |
| 5,525,920 | 6/1996 | Rakers et al. | 327/65 |

OTHER PUBLICATIONS

G.M. Yin, F. Op'Eynde, and W. Sansen, "A High–Speed CMOS Comparator with 8–b Resolution", IEEE Journal of Solid–State Circuits, vol. 27 No. 2, Feb. 1992.

Primary Examiner—Toan Tran
Attorney, Agent, or Firm—Scott W. McLellan

[57] ABSTRACT

A high resolution high speed comparator featuring a differential amplifier that is coupled to two high amplification output stages. The output stages assist in rapidly amplifying input signals, yet do not interfere with comparator offset cancellation. In a preferred embodiment the comparator is made up of three stages, an input sampling network, a first amplifier stage, and a second amplifier stage, with the high amplification output stages being located in the first amplifier stage.

21 Claims, 4 Drawing Sheets

HIGH RESOLUTION HIGH SPEED COMPARATOR

FIELD OF THE INVENTION

This invention relates to electronic signaling, and more particularly to the use of comparators for sampling electronic signals.

BACKGROUND OF THE INVENTION

Comparators are well own in the field of electronics. A typical comparator has two input terminals (a first input terminal and a second input terminal) and an output terminal. The voltages on the two input terminals are compared and the output depends on which of the two input voltages is grater. For example, if the input on the first terminal is larger than the input on the second terminal, the output is 2.5 volts (logic level 1); while if the input on the second terminal is grater than that on the first terminal, the output is −2.5 volts (logic level 0).

The use of comparators is well known in the art of electronic signaling. For example, in the telecommunications industry, comparators are employed to recover signals that have been degraded by noise. FIGS. 1A, 1B and 1C are provided to illustrate how a data recovery process works. FIG. 1A shows a stream of digital data in the form of an ideal square wave with a peak to peak value of 5 volts. The square wave is used to represent data generated by a differential signaling digital source, such as a computer. The data may be transmitted to a digital receiver through any number of possible transmission media, such as copper wire, fiber optic lines, coaxial cable, or wireless links. Regardless of the media used, the data signal will be attenuated by the media and corrupted by noise as it travels to the receiver.

FIG. 1B shows the signal of FIG. 1A as it appears upon arrival at a receiver. For purposes of illustration, the received signal is modeled as a sine wave of period 2T, although in practice the received signal is likely to have a more irregular shape. To recover the original data from the received signal, one input terminal of a comparator is coupled to the received signal while the other input terminal of the comparator is coupled to a reference (e.g. 0 volts). The comparator then compares samples of the received signal to the reference. If a sample is greater than the reference, the output of the comparator is 2.5 volts (logic level 1), and if a sample is less than the reference, the output of the comparator is −2.5 volts (logic level 0). This sampling technique works best if the received signal is sampled at its peaks and valleys, since sampling at the peaks and valleys provides the greatest differential between the samples and the reference, and thus the greatest margin for error. However, the received signal may be so weak that it is not possible for the comparator to determine whether a given sample is above the reference or below it. If for a given sample the comparator is able to make such a determination, then the comparator is said to be able to resolve the sample. The value of the smallest sample which a comparator can resolve is referred to as the comparator's resolution.

FIG. 1C illustrates the sampling of a weak received signal. As can be seen from the figure, the value of the signal at a first sample 10 is 2 mv, and the value of the signal at a second sample 12 is −2 mv. In order to resolve the signal against a 0 volt reference, a comparator must be able to amplify the first sample (2 mv) to a usable level (e.g. 2.5 v) before the taking of the second sample drives the amplification in a different direction. Of course, the second sample (−2 mv) must also be amplified to a usable level (e.g. −2.5 v) before the taking of a subsequent sample, and so on. The time interval between adjacent samples defines the comparator sampling frequency. The higher the sampling frequency, the less time the comparator has for amplification. Thus, in order for a comparator to achieve high resolution it must quickly determine if a sample is above or below the reference and quickly amplify the sample to a usable level. Typical comparator resolutions are on the order of 5 mv at a 40 MHz sampling frequency.

SUMMARY OF THE INVENTION

A comparator according to the present invention includes a differential amplifier that is coupled to two high amplification output stages. The output stages assist in rapidly amplifying input signals, yet do not interfere with comparator offset cancellation. In this manner, the comparator achieves both high speed and high resolution.

In a preferred embodiment the comparator is made up of three stages, an input sampling network, a first amplifier stage, and a second amplifier stage, with the high amplification output stages being located in the first amplifier stage. The input sampling network interfaces the two voltage levels that are to be compared with the first amplifier stage. The first amplifier stage then generates a low level signal that is dependent on the relative levels of the two inputs and passes the low level signal to the second amplifier stage. The second amplifier stage amplifies the output of the first amplifier stage to a usable level.

DETAILED DESCRIPTION

The present invention is typically implemented in a single integrated circuit, however other embodiments are possible.

Figure 1A:
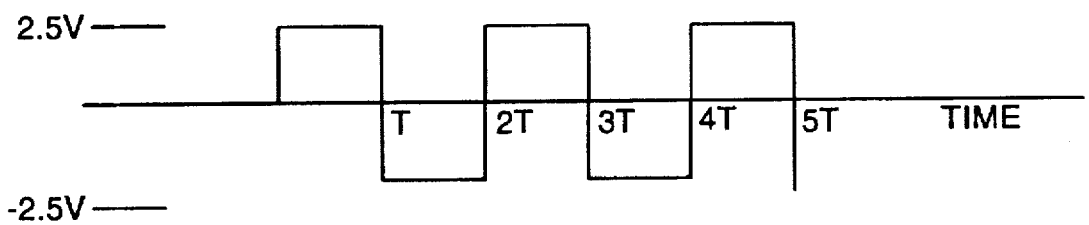
FIG. 1A is a signal diagram of a digital data transmission.
Figure 1B:
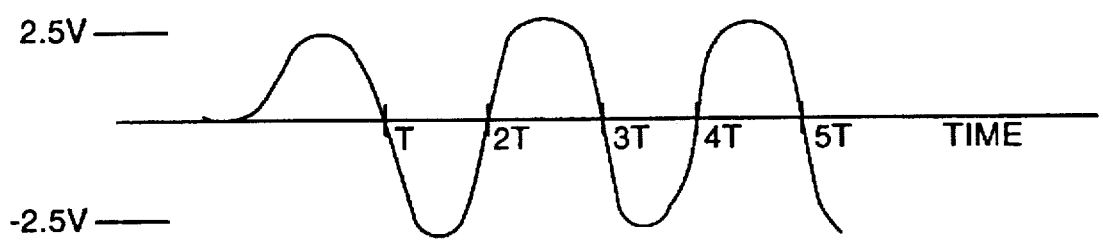
FIG. 1B is a signal diagram of digital data as it appears at a receiver.
Figure 1C:
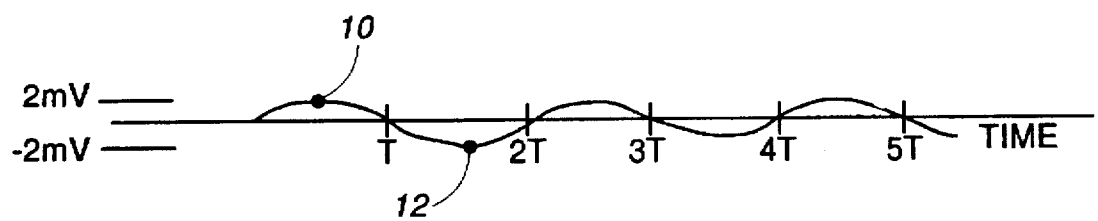
FIG. 1C is a signal diagram useful in describing the concept of comparator resolution.
Figure 2:
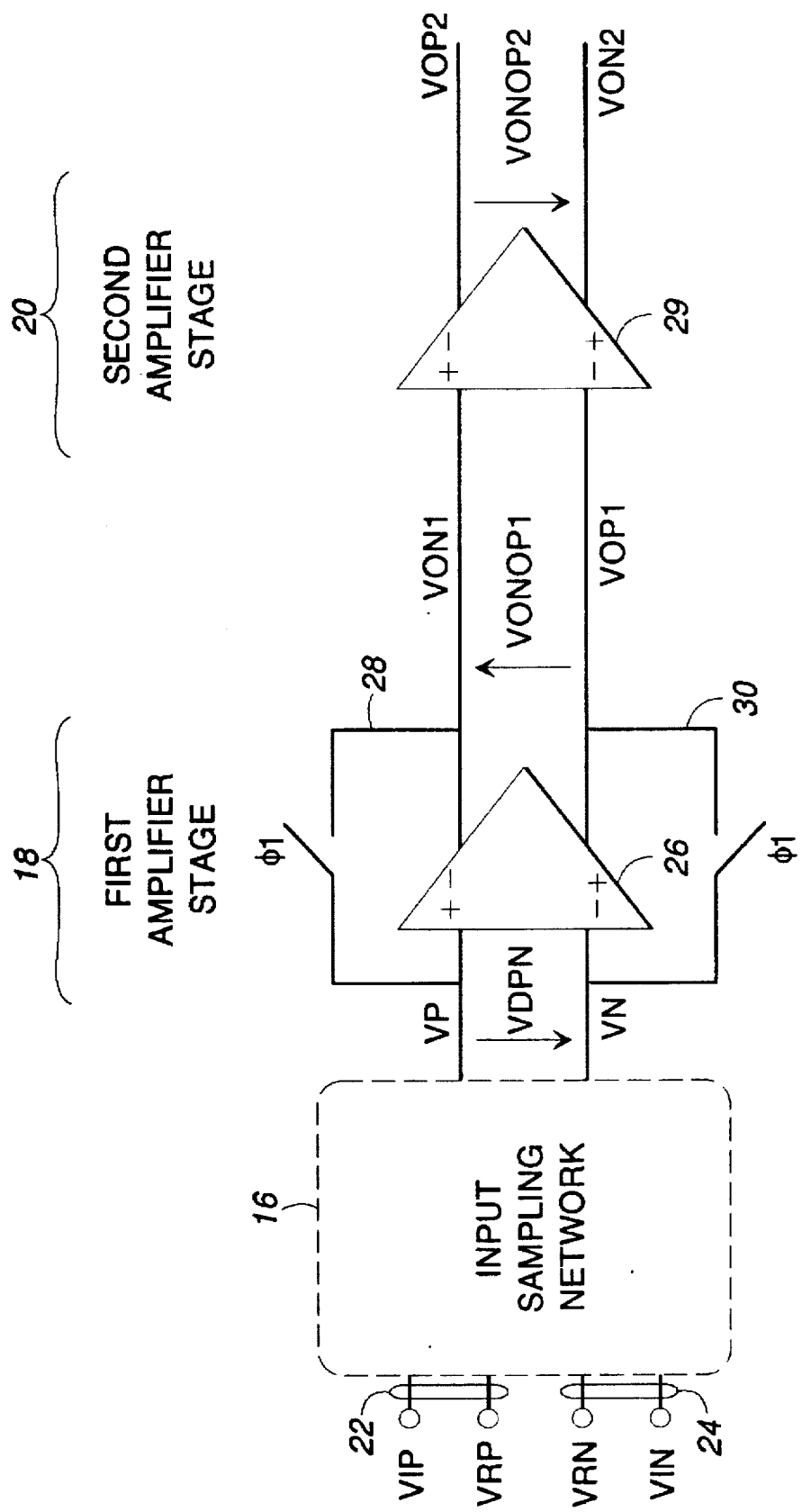
FIG. 2 is a block diagram of a preferred embodiment of a comparator according to the present invention.

FIG. 2 is a block diagram of a preferred embodiment of a comparator according to the present invention. The comparator is made up of three stages an input sampling network 16, a first amplifier stage 18, and a second amplifier stage 20. The input sampling network accepts two differential signal inputs, a first differential signal input through terminal pair 22, and a second differential signal input through terminal pair 24. The network passes the input signals to the first stage amplifier which includes an operational amplifier 26 and feedback loops 28 and 30. The operational amplifier 26 is used to generate a low level output signal based on a comparison of the inputs received from the sampling network, and to pass that low level output signal to an operational amplifier 29 in the second amplifier stage for amplification to a usable level. The feedback loops are used during offset cancellation (clock phase $\phi_1$). Both the input sampling network and the first amplifier stage are discussed in more detail below.

Figure 3:
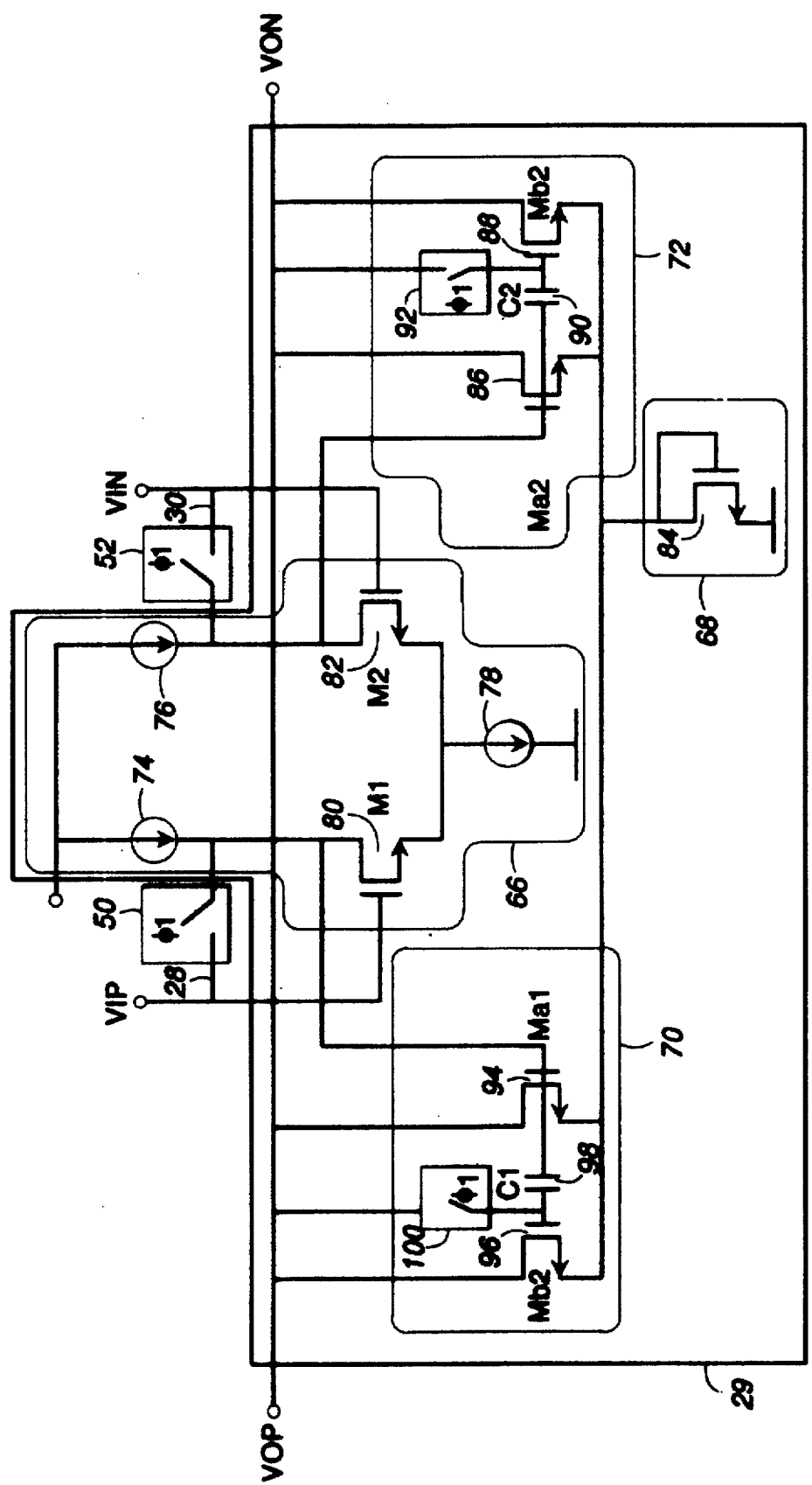
FIG. 3 is a circuit diagram of the first amplifier stage of a comparator according to the present invention.

FIG. 3 is a circuit diagram of a preferred embodiment of the first amplifier stage of a comparator according to the present invention. As described above, the amplifier stage includes operational amplifier 29, feedback loop 28 with switch 50, and feedback loop 30 with switch 52. The operational amplifier is made up of four sub-parts, a differential amplifier 66, a biasing circuit 68, a first output stage 70, and a second output stage 72. A standard differential amplifier circuit model is shown to represent the differential amplifier. It includes current sources 74, 76 and 78, and MOSFETs (Metal-Oxide Semiconductor Field-Effect Transistors) 80 and 82. Differential amplifiers are well known and there are many such amplifiers suitable for use with the invention. Similarly, biasing circuits are well known and many different types may be used with the invention. The biasing circuit shown in FIG. 3 is a MOSFET 84 having its gate and source coupled together and its drain coupled to ground. Output stages 70 and 72 are where the advantages of the amplifier stage of FIG. 3 are realized.

Output stage 72 includes a first MOSFET 86 and a second MOSFET 88, each having its source coupled to Von and its drain coupled to the biasing circuit. The gate of MOSFET 86 is coupled to Vop while the gate of MOSFET 88 is coupled to the gate of MOSFET 86 via capacitor 90. A switch 92 selectively couples the gate of MOSFET 88 to Von. Output stage 70 is similarly configured. It includes MOSFETS 94 and 96, capacitor 98 and switch 100. It should be noted that although the transistor elements of FIG. 3 are described as MOSFETS, many other transistor types may be used without departing from the spirit of the invention.

The amplifier of FIG. 3 must operate in two modes, offset cancellation and sampling. The output stages function to provide the desired results for both modes. A functional description of the output stages is provided below. Since the output stages are identical, a description of one stage sufficiently describes both of them, and therefore only output stage 72 will be described in detail.

During offset cancellation switch 92 is closed and the inputs to the gates of MOSFETS 86 and 88 are Vop and Von, respectively. Vop and Von are differential amplifier outputs, and are therefore equal in magnitude and opposite in polarity. Since MOSFETS 86 and 88 have their gates coupled to Vop and Von, yet have their sources and drains coupled together, they each cancel the effect of the other. That is, during offset cancellation, output stage 72 behaves as an open circuit. Furthermore, offset cancellation drives the amplifier stage towards a steady state, making capacitor 90 look like an open circuit and negating any effect that capacitor 90 might have on the cancelling MOSFETS. Thus, during offset cancellation, output stage 72 drops out of the circuit as desired and does not interfere with the offset cancellation operation. By not interfering with the offset calculation, output stage 72 allows for a smaller residual offset, and therefore a higher comparator resolution, because it is the residual offset that determines the achievable resolution.

In sampling mode switch 92 is open. The input to MOSFET 86 is Vop and the input to MOSFET 88 is also Vop. Although the gate of MOSFET 88 is coupled to Vop through capacitor 90, capacitor 90 looks like a short circuit during sampling mode and the coupling is effective. The reason capacitor 90 looks like a short circuit during sampling mode is that the differential amplifier outputs are changing rapidly to respond to the differential amplifier inputs. In particular, the rapid change of Vop makes it an AC signal that passes through capacitor 90. Thus, in sampling mode MOSFETS 86 and 88 work together to amplify the Vop output of the differential amplifier, providing a nominal amplification that is equal to twice that which could be provided by either MOSFET alone. Similarly, MOSFETS 94 and 96 work together to amplify the Von output of the differential amplifier. This dual amplification of differential amplifier outputs provides for rapid amplification of low level differential amplifier input signals, allowing the differential amplifier to respond quickly to low level inputs, and increasing the speed and resolution of the comparator.

Figure 4:
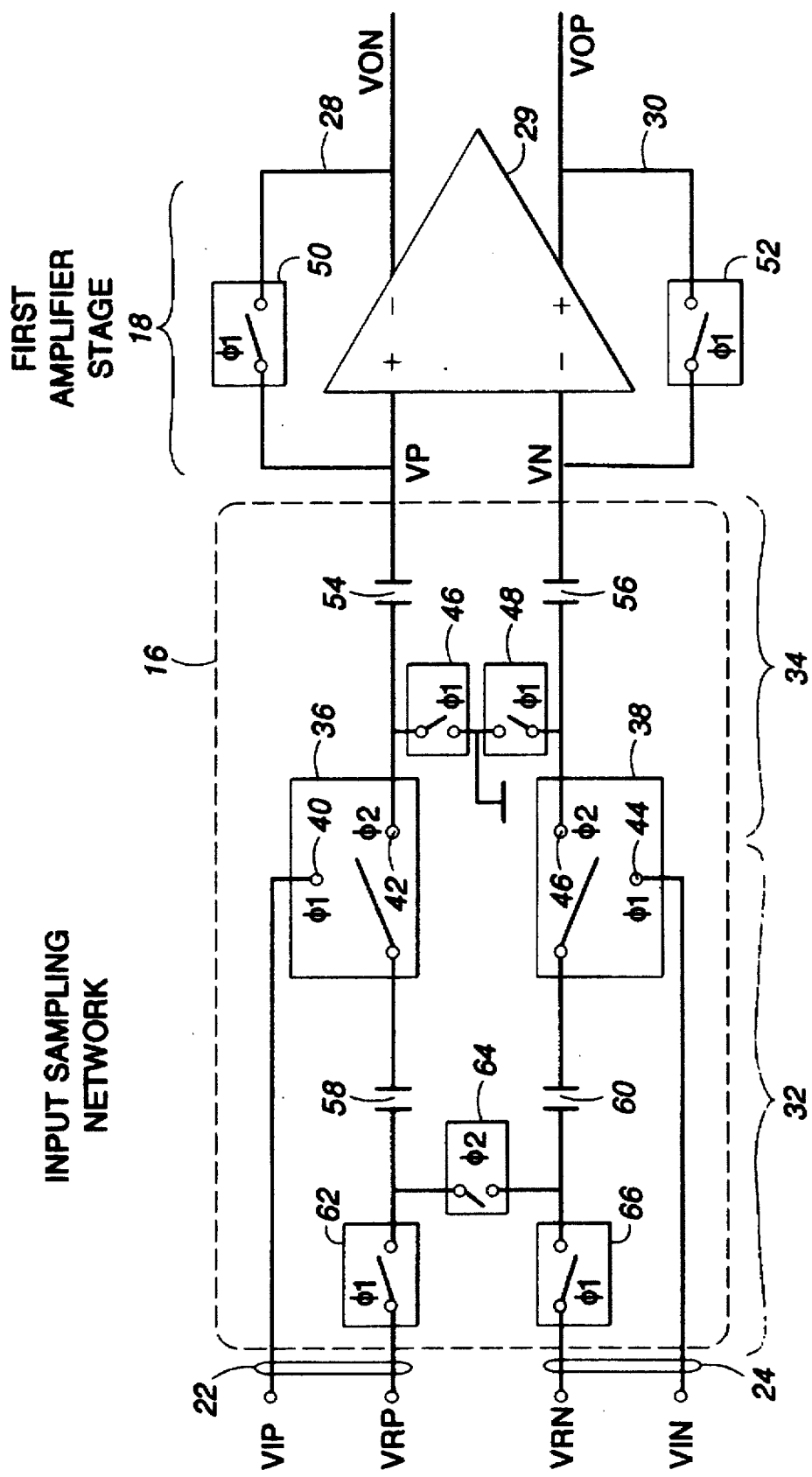
FIG. 4 is a schematic diagram of the input sampling network and first amplifier stage of a comparator according to the present invention.

FIG. 4 shows the input sampling network in greater detail. Also shown is the first amplifier stage. The symbols $\phi_1$ and $\phi_2$ refer to the two portions of the comparators clock cycle, offset cancellation ($\phi_1$) and input sampling ($\phi_2$). The symbols are used in the figure to denote switch positions. A label of $\phi_1$ next to a terminal indicates that the switch associated with the terminal contacts the terminal during the offset cancellation portion of the cycle and does not contact the terminal during the sampling portion. Similarly, a label of $\phi_2$ next to a 1 terminal indicates that the switch associated with the terminal contacts the terminal during the sampling portion of the cycle and does not contact the terminal during the offset cancellation portion.

As can be seen from the figure, the input sampling network is made up of two parts an input stage 32 and an offset stage 34. The two stages are selectively coupled and decoupled through switches 36 and 38. During offset cancellation switch 36 is in the position denoted by terminal 40 and switch 38 is in the position denoted by terminal 44. At the same time, switches 46, 48, 50 and 52 are closed. Thus, during offset cancellation, operational amplifier 29 is configured as a voltage follower. Accordingly, any offset voltage that is present within amplifier 29 appears at the output of the amplifier. The voltage appearing at the output is fed back to the input via loops 28 and 30 and stored on capacitors 54 and 56. In this manner, the voltage necessary to cancel the amplifiers offset is stored on capacitors 54 and 56.

While the offset cancellation is being stored on capacitors 54 and 56, the input sample is being stored on capacitors 58 and 60. During offset cancellation switch 36 is in the terminal 40 position, switch 62 is closed, and switch 64 is open. Thus, the potential that is applied across terminals 22 (first input) is stored on capacitor 58. Similarly, switch 38 is in the terminal 44 position and switch 66 is closed, and the voltage across terminals 24 (second input) is stored on capacitor 60. Capacitors 58 and 60 track the inputs closely such that at any moment of time the voltage across the capacitors is equal to the instantaneous input voltages.

At the end of the offset cancellation phase the input stage and offset stage are coupled together. Switches 36 and 38 change position to terminals 42 and 46, respectively. Switch 64 closes and switches 62, 66, 46 and 48 open. Thereby, the sample voltages stored on capacitors 58 and 60 are added to the offset voltages stored on capacitors 54 and 56 and the totals are passed to the operational amplifier for comparison. There is no feedback through loops 28 and 30 during the sample phase because switches 50 and 52 also open at the end of the offset cancellation phase. It is important to note that the inputs to the comparator do not directly drive the first amplifier stage, and therefore do not drive the operational amplifier 29 deep into an undesired output state at a time when a rapid change of output state is required. In other words, the first amplifier stage is not driven in any direction during $\phi_1$ and is thus neutral when it is connected to the input sample at the beginning of $\phi_2$.

Several embodiments for the invention have been described in detail. However, it should be obvious that there are many further variations evident to persons skilled in the art. For example, the comparator may accept single ended signals rather than differential signals and may generate single ended output rather than differential output. Also, the differential amplifier with high amplification output stages may be applied in any circuit where rapid amplification of low level amplifier inputs is useful. The invention is more particularly defined in the appended claims.

I claim:

1. An integrated circuit including an output stage for use in amplifying outputs of a differential amplifier, the output stage comprising:
   a) a first transistor having a first terminal, a second terminal, and a third terminal;
   b) a second transistor having a first terminal, a second terminal, and a third terminal; and
   c) a storage element that couples said first terminal of said first transistor to said first terminal of said second transistor;
   d) wherein said first terminal of said first transistor is coupled to a first output stage and to a first output of the differential amplifier, and said second terminal of said first transistor and said second terminal of said second transistor are coupled to a second output of the stage and to a second output of the differential amplifier.

2. The invention of claim 1, wherein said storage element is a capacitor.

3. The invention of claim 1, wherein said first and second transistors are MOSFETs.

4. The invention of claim 1, wherein said third terminal of said first transistor and said third terminal of said second transistor are coupled to a biasing circuit.

5. The invention of claim 1, further comprising a switch for selectively coupling said first terminal of said second transistor to said second output of the differential amplifier.

6. An integrated circuit including a comparator, the comparator comprising:
   a) an operational amplifier including
      (i) a differential amplifier; and
      (ii) an output stage for amplifying outputs of said differential amplifier, said output stage having
         (a) a first transistor having a first terminal, a second terminal, and a third terminal;
         (b) a second transistor having a first terminal, a second terminal, and a third terminal; and
         (c) a storage element that couples said first terminal of said first transistor to said first terminal of said second transistor;
         (d) wherein said first terminal of said first transistor is coupled to a first output of the operational amplifier and to a first output of said differential amplifier, and said second terminal of said first transistor and said second terminal of said second transistor are coupled to a second output of the operational amplifier and to a second output of said differential amplifier;
   b) a first feedback loop for coupling said first output of said differential amplifier to a first input of said differential amplifier, said first feedback loop including a switch for selectively opening and closing said first feedback loop; and
   c) a second feedback loop for coupling said second output of said differential amplifier to a second input of said differential amplifier, said second feedback loop including a switch for selectively opening and closing said second feedback loop.

7. The invention of claim 6, wherein said storage element of said output stage is a capacitor.

8. The invention of claim 6, wherein said first and second transistors of said output stage are MOSFETs.

9. The invention of claim 6, wherein said third terminal of said first transistor and said third terminal of said second transistor are coupled to a biasing circuit.

10. The invention of claim 6, further comprising a switch for selectively coupling said first terminal of said second transistor to said second output of said differential amplifier.

11. An integrated circuit including a comparator, the comparator comprising:
    a) an operational amplifier including
       (i) a differential amplifier; and
       (ii) an output stage for amplifying outputs of said differential amplifier, said output stage having
          (a) a first transistor having a first terminal, a second terminal, and a third terminal;
          (b) a second transistor having a first terminal, a second terminal, and a third terminal; and
          (c) a storage element that couples said first terminal of said first transistor to said first terminal of said second transistor;
          (d) wherein said first terminal of said first transistor is coupled to a first output of the operational amplifier a first output of said differential amplifier, and said second terminal of said first transistor and said second terminal of said second transistor are coupled to a second output of the operational amplifier and to a second output of said differential amplifier; and
    b) an input sampling network for interfacing one or more input signals with said operational amplifier.

12. The invention of claim 11, further comprising:
    a first feedback loop for coupling said first output of said differential amplifier to a first input of said differential amplifier, said first feedback loop including a switch for selectively opening and closing said first feedback loop; and
    a second feedback loop for coupling said second output of said differential amplifier to a second input of said differential amplifier, said second feedback loop including a switch for selectively opening and closing said second feedback loop.

13. The invention of claim 11, wherein said storage element of said output stage is a capacitor.

14. The invention of claim 11, wherein said first and second transistors of said output stage are MOSFETs.

15. The invention of claim 11, wherein said third terminal of said first transistor and said third terminal of said second transistor are coupled to a biasing circuit.

16. The invention of claim 11, further comprising a switch for selectively coupling said first terminal of said second transistor to said second output of said differential amplifier.

17. The invention of claim 11, further comprising a second amplifier stage for amplifying said first and second outputs of said operational amplifier.

18. The invention of claim 17, wherein said storage element of said output stage is a capacitor.

19. The invention of claim 17, wherein said first and second transistors of said output stage are MOSFETs.

20. The invention of claim 17, wherein said third terminal of said first transistor and said third terminal of said second transistor are coupled to a biasing circuit.

21. The invention of claim 17, further comprising a switch for selectively coupling said first terminal of said second transistor to said second output of said differential amplifier.

* * * * *